United States Patent
Huang et al.

(10) Patent No.: US 8,963,603 B2
(45) Date of Patent: Feb. 24, 2015

(54) CLOCK GENERATOR AND METHOD THEREOF

(71) Applicant: Realtek Semiconductor Corp., Hsinchu (TW)

(72) Inventors: Shih-Hsiun Huang, Chang Hua County (TW); Shian-Ru Lin, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/245,515

(22) Filed: Apr. 4, 2014

(65) Prior Publication Data
US 2014/0300397 A1  Oct. 9, 2014

(30) Foreign Application Priority Data
Apr. 9, 2013 (TW) ............... 102112446 A (51) Int. Cl.
*G06F 1/04* (2006.01)
*H03K 3/86* (2006.01)
(52) U.S. Cl.
CPC ........................................ *H03K 3/86* (2013.01)
USPC ............................ 327/291; 327/295; 327/298

(58) Field of Classification Search
USPC .................................... 327/291, 293, 295–298
See application file for complete search history.

(56) References Cited

U.S. PATENT DOCUMENTS

| | | | | |
|---|---|---|---|---|
| 5,341,031 A | * | 8/1994 | Kinoshita et al. | 327/259 |
| 7,386,083 B2 | * | 6/2008 | Baba | 375/371 |

* cited by examiner

*Primary Examiner* — An Luu
(74) *Attorney, Agent, or Firm* — Muncy, Geissler, Olds & Lowe, P.C.

(57) ABSTRACT

A clock generation device includes a first delay unit, a frequency divider, an angle delay unit and a first calculating unit. The first delay unit receives an input clock and delays the input clock by a first preset period to generate an input delay clock. The frequency divider divides a frequency of the delay clock to generate a first frequency-divided clock and a second frequency-divided clock. A frequency of each of the first frequency-divided clock and the second frequency-divided clock is a preset multiple of the input delay clock. The angle delay unit delays the first frequency-divided clock by a second preset period to generate a first delay clock. The first calculating unit determines a trigger time of a first edge of a first output clock with reference to voltage levels of the first frequency-divided clock and the first delay clock and determines a falling time of a second edge of the first output clock with reference to voltage levels of the input clock and the first delay clock.

17 Claims, 10 Drawing Sheets

CLOCK GENERATOR AND METHOD THEREOF

This application claims the benefit of the filing date of Taiwan Application Ser. No. TW 102112446, filed on Apr. 9, 2013, the content of which is incorporated herein by reference.

BACKGROUND OF THE INVENTION (a) Field of the Invention

The invention relates to an electronic device, particularly to a clock generation device and method thereof.

(b) Description of the Related Art

In an N-channel time-interleaved analog-to-digital converter, "N" (N is a positive integer) analog-to-digital converters are connected in parallel to form N channels to increase the sampling rate of the analog-to-digital converter by N times. However, a time-interleaved analog-to-digital converter still has non-ideal problems, such as sampling timing mismatch between the N analog-to-digital converters (i.e., sampling timing skew) or gain mismatch and offset mismatch between the N analog-to-digital converters.

Figure 1A:
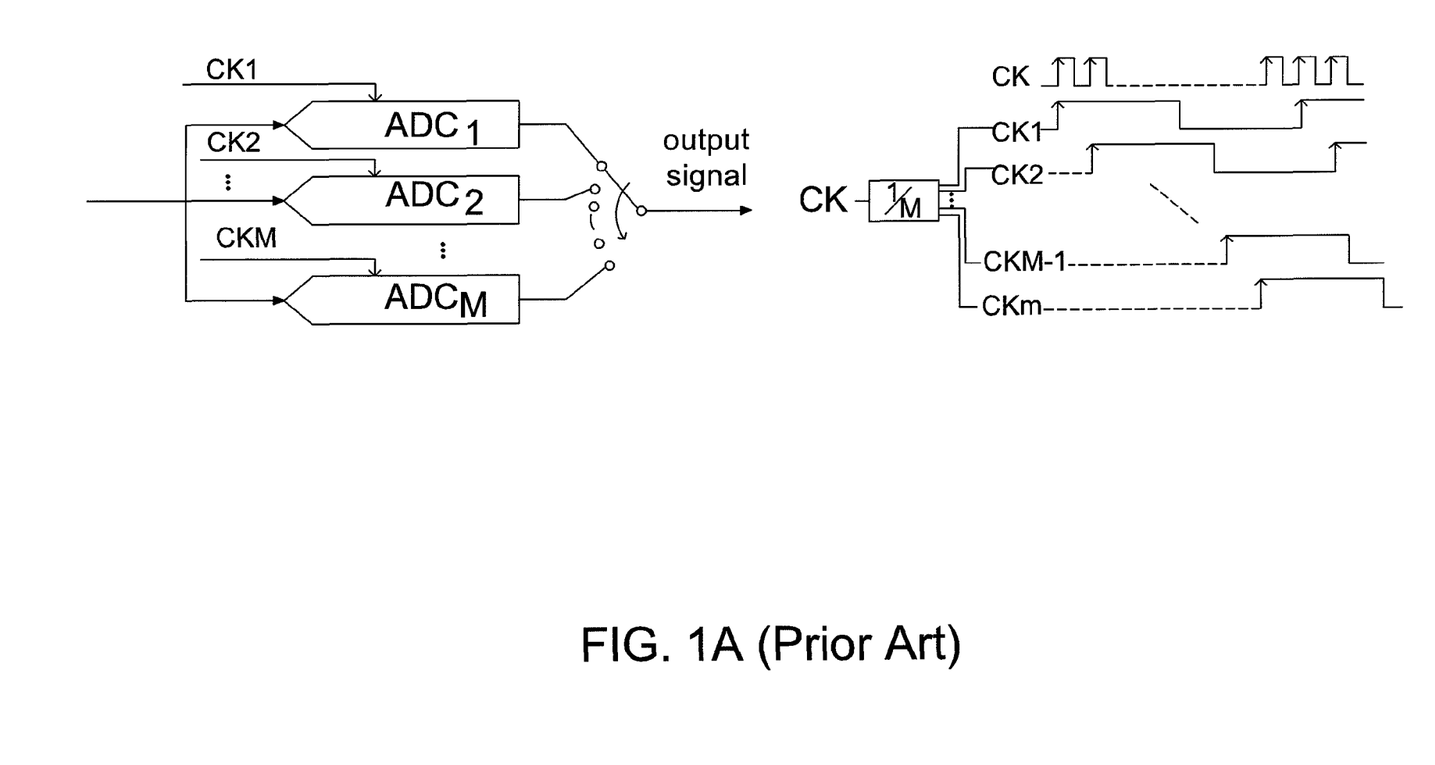
FIG. 1A shows a schematic diagram illustrating a conventional time-interleaved analog-to-digital converter.

Sampling timing mismatch is due to different sampling cycles of the channels of analog-to-digital converters. For example, as shown in FIG. 1A, an analog-to-digital converter with a sampling rate of 1 GHz comprises M analog-to-digital converters ADC1, ADC2~ADCM (the number of ADC is M), with a sampling rate of 250 MHz. For now, four analog-to-digital converters are used as an example (M=4). When the analog-to-digital converter ADC1 finishes signal sampling, the analog-to-digital converter ADC2 starts sampling after a first interval of 1/1 GHz (that is, 1 ns) has elapsed. Then, the analog-to-digital converter ADC3 starts sampling after the analog-to-digital converter ADC2 finishes signal sampling and a second interval of 1/1 GHz (that is, 1 ns) has elapsed. Likewise, the signals shown on the right-hand side of FIG. 1A are generated. Practically, the sampling timing between channels of the analog-to-digital converters cannot be set to a 1-ns interval accurately, resulting in sampling timing mismatch of N analog-to-digital converters.

Figure 1B:
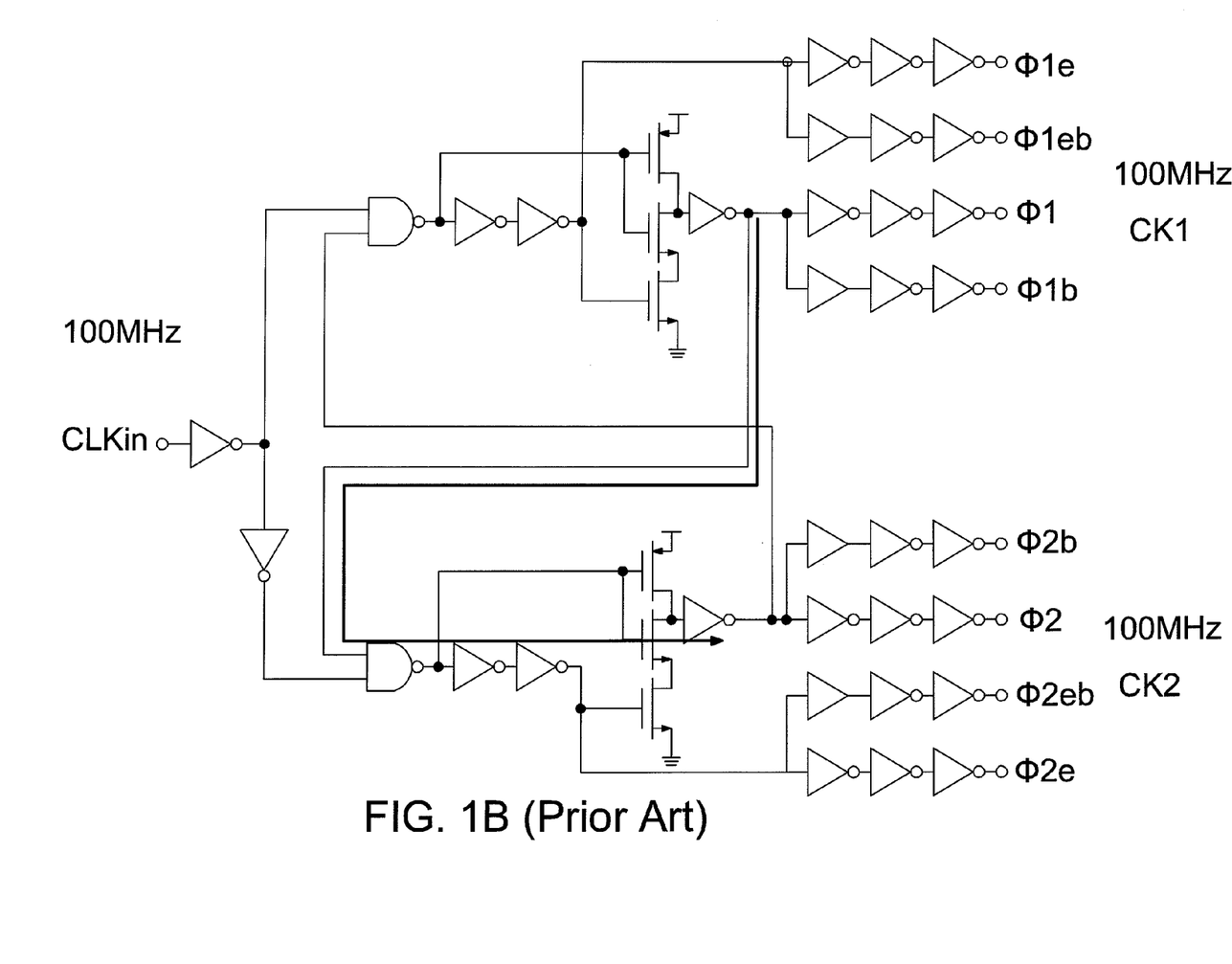
FIG. 1B shows a schematic diagram illustrating a conventional clock generation device.

Sampling timing mismatch is caused by different signal path lengths of the signal sources of the analog-to-digital converters and an asymmetric circuit configuration. For example, a conventional non-overlapping clock generator is shown in FIG. 1B. The non-overlapping clock generator generates clocks CK1 and CK2 as the clock sources of a 2-channel time-interleaved analog-to-digital converter. The following problems may occur.

At first, clocks CK1 and CK2 are generated through a path marked by the bold faced arrow, in order to produce non-overlapping clocks. Since the path from the clock CLKin to the clock CK1 and the path from the clock CLKin to the clock CK2 cannot be too short and there are physical limitations in chip fabrication to fabricate exactly the same elements, the mismatch between the path from the clock CLKin to the clock CK1 and the path from the clock CLKin to the clock CK2 causes the 2-channel time-interleaved analog-to-digital converter to have sampling timing mismatch to reduce circuitry performance. Moreover, even though the physical limitations in chip fabrication is disregarded, as shown in FIG. 1B, the configuration of the clock generation circuit is asymmetric and thus the interval between providing the clock CLKin and generating the clock CK1 is different from that between providing the clock CLKin and generating the clock CK2.

BRIEF SUMMARY OF THE INVENTION

One object of the invention is to provide a clock generation device and a method thereof to prevent from the mismatch problem of multiple clock paths in a conventional clock generation device.

One object of the invention is to provide a clock generation device and a method thereof to prevent from the time mismatch problem of multiple clocks in a conventional clock generation device.

One embodiment of the invention provides a clock generation device, comprising: a first delay unit, a frequency divider, an angle delay unit, and a first calculating unit. The first delay unit receives an input clock and delays the input clock by a first preset period to generate an input delay clock. The frequency divider receives the input delay clock and divides a frequency of the input delay clock to generate a first frequency-divided clock and a second frequency-divided clock. A frequency of each of the first frequency-divided clock and the second frequency-divided clock is a preset multiple of the input delay clock. The angle delay unit delays the first frequency-divided clock by a second preset period to generate a first delay clock at a first output terminal of the angle delay unit. The first calculating unit determines a trigger time of a first edge of a first output clock with reference to voltage levels of the first frequency-divided clock and the first delay clock and determines a falling time of a second edge of the first output clock with reference voltage levels the input clock and the first delay clock.

Another embodiment of the invention provides a clock generation device, comprising: a first delay unit, a frequency divider, an angle delay unit, and a plurality of calculating units. The first delay unit receives an input clock and delays the input clock by a first preset period to generate an input delay clock. The frequency divider receives the input delay clock and divides a frequency of the input delay clock to generate a plurality of frequency-divided clocks. Each frequency of each frequency-divided clock is a preset multiple of the input delay clock. The angle delay unit delays each frequency-divided clock by a second preset period to generate a plurality of output delay clocks. Each of the calculating units determines trigger time of a first edge of an output clock with reference to one frequency-divided clock and one output delay clock and determines falling time of a second edge of the output clock with reference to the input clock and the output delay clock. The output clocks generated by the calculating units do not overlap with each other. The calculating unit comprises a first transistor, a second transistor, a third transistor, and a fourth transistor. The first transistor and the second transistor are connected in series to form a first path, the third transistor and the fourth transistor are connected in series to form a second path, the first path and the second path are connected in parallel to execute an equation given by: ck=(c·ca)+(c·cks), where ck denotes the output clock, ca denotes the frequency-divided clock, c denotes the output delay clock, and cks denotes the input clock.

Furthermore, one other embodiment of the invention provides a clock generation method, comprising the following steps. At first, it is to receive an input clock and delay the input clock by a first preset period to generate an input delay clock. The input delay clock is received and a frequency of the input delay clock is divided to generate a plurality of frequency-divided clocks. Each frequency of each frequency-divided clock is a preset multiple of the input delay clock. Each frequency-divided clock is delayed by a second preset period to generate a plurality of output delay angle clocks. A trigger time of a first edge of an output clock is determined with reference to voltage levels of one of the frequency-divided clocks and one of the output delay angle clocks and a falling time of a second edge of the output clock is determined with reference to voltage levels of the input clock and the output delay angle clock. The output clocks do not overlap with each other.

The clock generation device and the clock generation method according to the present invention uses logic circuits to control the stop-sampling edges of the output clocks without the mismatch problem due to misalignment of sampling timing. Besides, no longer delay path like the prior art is required so as to reduce the mismatch problem caused by mismatch of the path lengths between the output clocks generated by the clock generation device of the prior art. Non-overlapping clocks can be provided precisely and the mismatch problem due to long signal paths in the prior art can be resolved.

DETAILED DESCRIPTION OF THE INVENTION

Figure 2A:
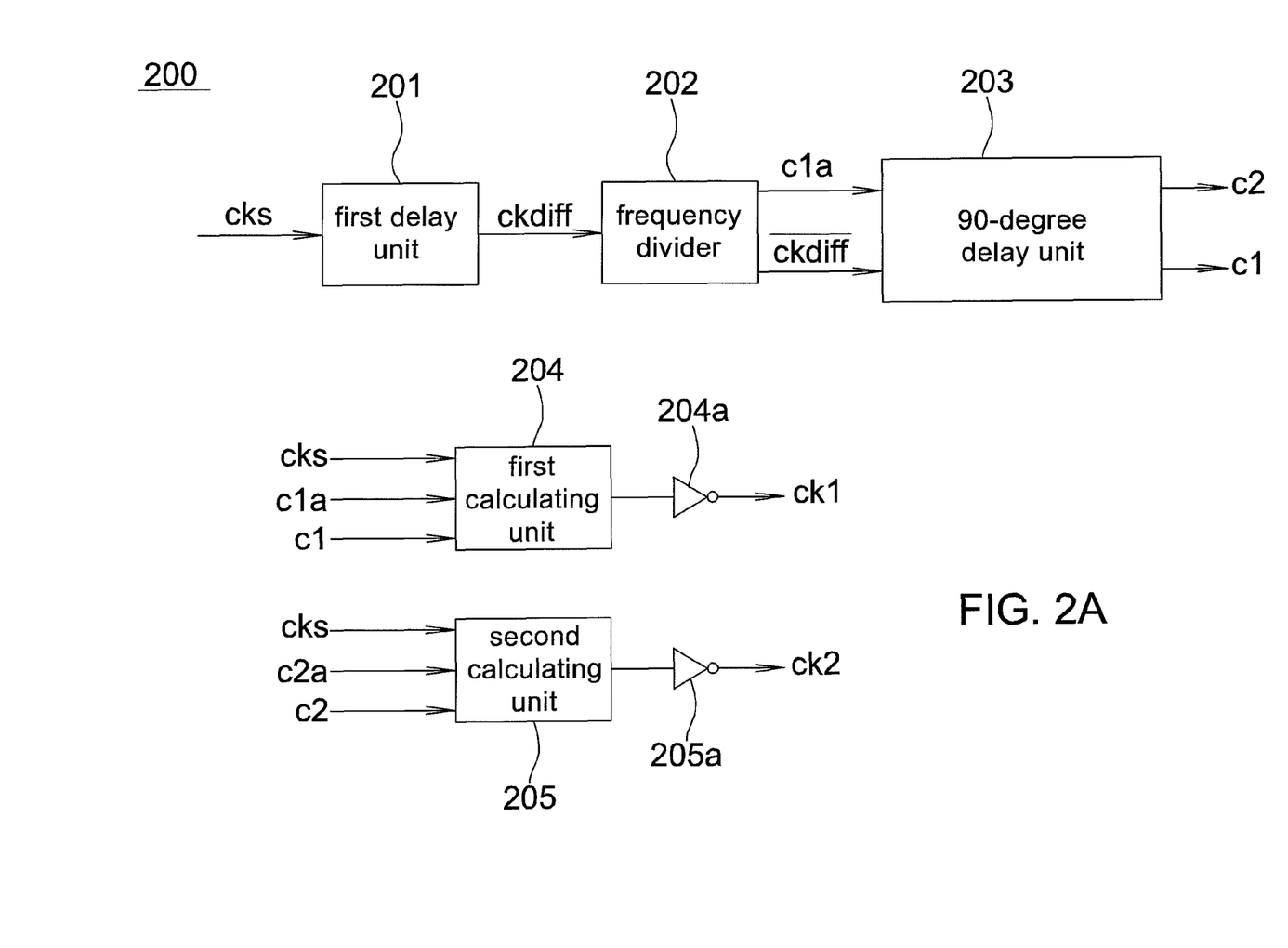
FIG. 2A shows a schematic diagram illustrating a clock generation device in an embodiment of the invention.

FIG. 2A shows a schematic diagram illustrating a clock generation device in an embodiment of the invention. The clock generation device 200 is a divide-by-N clock generator having low sampling timing skew. The clock generation device 200 comprises a first delay unit 201, a frequency divider 202, a 90-degree delay unit 203, a first calculating unit 204, and a second calculating unit 205.

The first delay unit 201 receives an input clock cks and delays the input clock cks by a preset period d1 to generate an input delay clock ckdiff.

The frequency divider 202 receives the input delay clock ckdiff, outputs an inverted input delay clock $\overline{ckdiff}$ and divides the frequency of the input delay clock ckdiff to generate a first frequency-divided clock c1a and a second frequency-divided clock c2a (not shown in the figure). The frequency of each of the first frequency-divided clock c1a and the second frequency-divided clock c2a is a preset multiple (1/N where N is a nature number less than infinity) of that of the input delay clock ckdiff. For example, each of the first frequency-divided clock c1a and the second frequency-divided clock c2a has one-half (½) the frequency of the input delay clock ckdiff.

The 90-degree delay unit 203 receives the first frequency-divided clock c1a and the inverted input delay clock $\overline{ckdiff}$ and delays the first frequency-divided clock c1a by a second preset period d2 (for example delaying by 90 degrees of a cycle) to generate a first delay clock c1 and a second delay clock c2. In this embodiment, the delay of 90 degrees of a cycle is only one example and the present invention is not limited to this example. The second preset period d2 can be designed to meet various requirements.

The first calculating unit 204 determines a trigger time of a first edge (positive edge) of a first output clock ck1 with reference to voltage levels of the first frequency-divided clock c1a and the first delay clock c1 and determines a falling time of a second edge (negative edge) of the first output clock ck1 with reference to voltage levels of the input clock cks and the first delay clock c1. An inverter 204a is used to invert the output signal of the first calculating unit 204 and generate the first output clock ck1.

The second calculating unit 205 determines a trigger time of a first edge (positive edge) of a second output clock ck2 with reference to voltage levels of the second frequency-divided clock c2a and the second delay clock c2 and determines a falling time of a second edge (negative edge) of the second output clock ck2 with reference to voltage levels of the input clock cks and the second delay clock c2. An inverter 205a is used to invert the output signal of the second calculating unit 205 and generate the second output clock ck2.

Figure 2B:
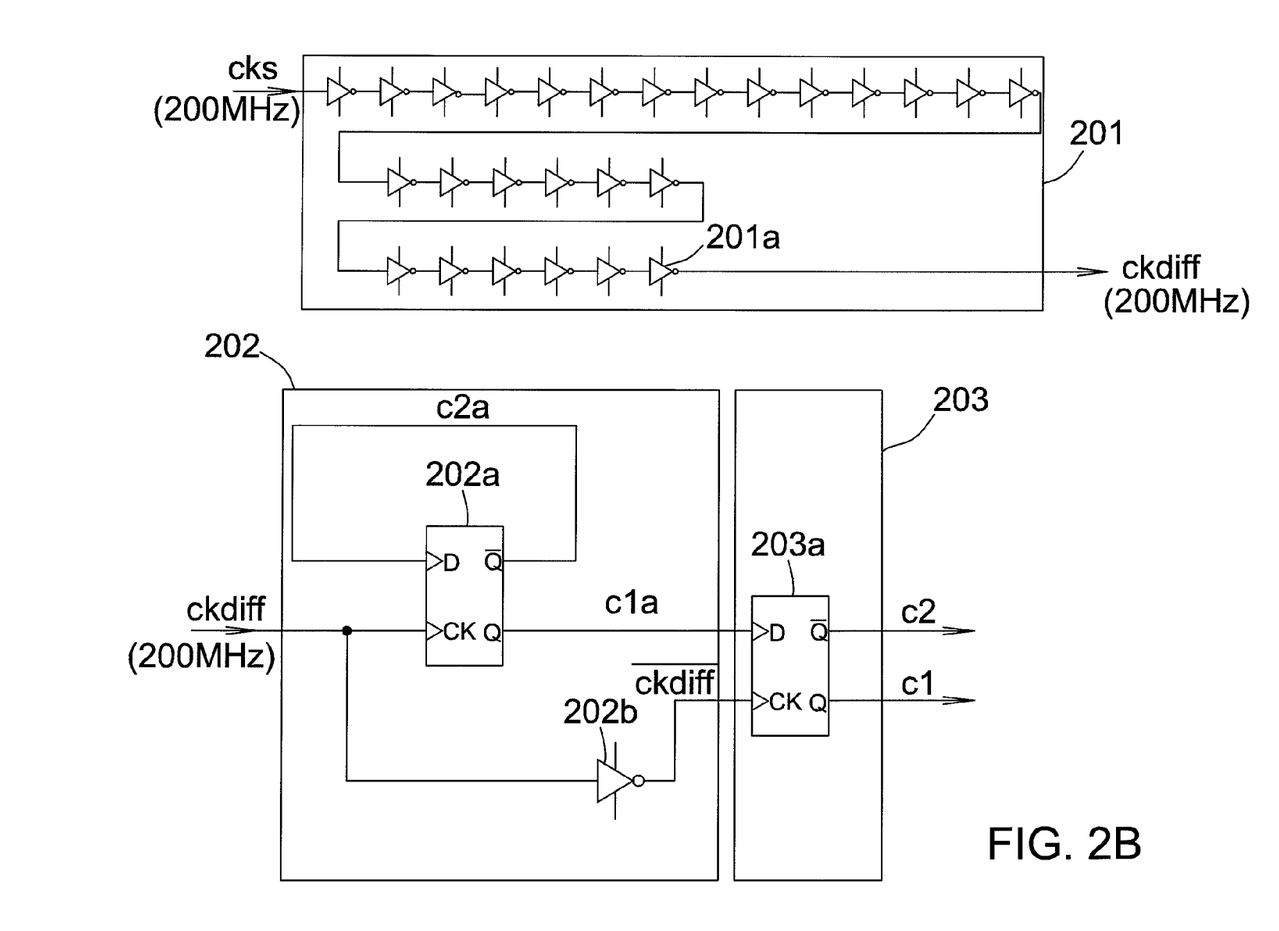
FIG. 2B shows a schematic diagram illustrating a delay unit and a frequency divider in an embodiment of the invention.
Figure 2C:
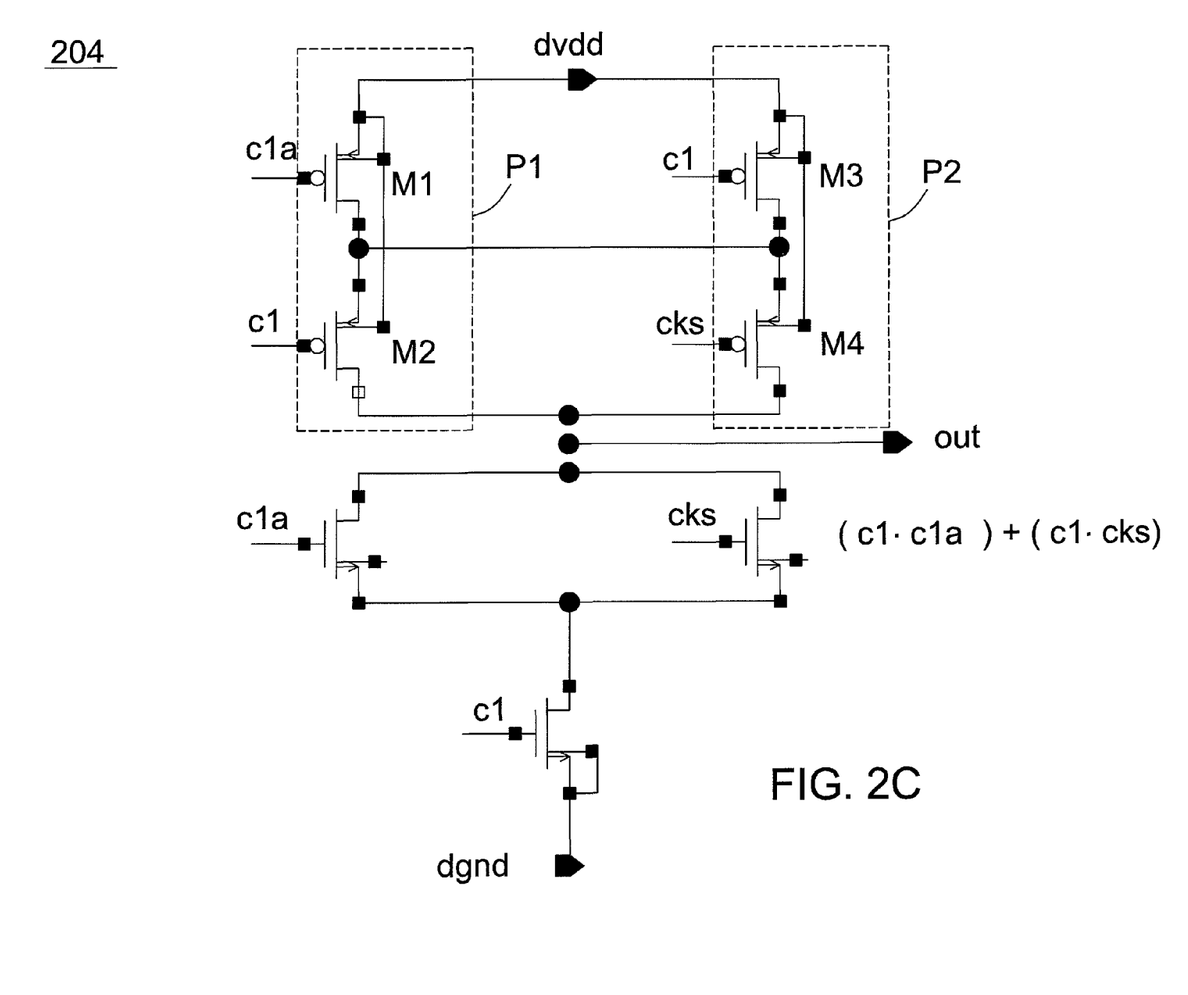
FIG. 2C shows a schematic diagram illustrating a calculating unit in an embodiment of the invention.

FIGS. 2B and 2C show the clock generation device 200 in an embodiment of the invention.

The first delay unit 201 comprises a plurality of inverters 201a connected in series to delay the input clock cks by a preset period d1 (not shown in the figure) to generate a delay clock ckdiff.

The frequency divider 202 comprises a first flip-flop 202a and an inverter 202b. The 90-degree delay unit 203 comprises a second flip-flop 203a. The first flip-flop 202a receives the input delay clock ckdiff and uses the input delay clock ckdiff as a clock signal. With reference to the input delay clock ckdiff, the first flip-flop 202a generates the first frequency-divided clock c1a at its output terminal (Q) and generates the second frequency-divided clock at the inverted output terminal (/Q). The frequencies of the first frequency-divided clock c1a and the second frequency-divided clock c2a are reduced from 200 MHz (the frequency of ckdiff) to 100 MHz. The inverter 202b inverts the input delay clock ckdiff to generate the inverted input delay clock $\overline{ckdiff}$. The second flip-flop 203a uses the inverted input delay clock $\overline{ckdiff}$ as a clock signal. Then, the second flip-flop 203a of the 90-degree delay unit 203 delays the first frequency-divided clock c1a by a second preset period d2 and generates a first delay clock c1 at its output terminal (Q) and a second delay clock c2 at its inverted output terminal (/Q).

In this embodiment, frequencies of the first frequency-divided clock c1a and the second frequency-divided clock c2a are one half of the frequency of the input delay clock ckdiff, reducing the frequencies from 200 MHz to 100 MHz. Certainly, the above frequency-dividing scheme and the preset multiple are provided by way of examples and not limitations of the present invention. It should be understood, however, that the invention is fully extensible to any existing or yet-to-be developed circuits that can be used to perform frequency dividing and the preset divisor can be designed to meet any requirement.

FIG. 2C shows a schematic diagram illustrating the first calculating unit 204 in an embodiment of the invention. The first calculating unit 204 comprises a plurality of transistors M1, M2, M3, and M4. The transistor M1 receives the first frequency-divided clock c1a. The transistor M2 is coupled to the transistor M1 and receives the first delay clock c1. The transistor M3 is coupled to the transistor M1 and receives the first delay clock c1. The transistor M4 is coupled to the transistors M3 and M2 and receives the input clock cks.

In one embodiment, the transistors M1 and M2 are connected in series to form a first path P1 and the transistors M3 and M4 are connected in series to form a second path P2. The first path P1 and the second path P2 are connected in parallel to execute the following equation:

$$ck1 = (c1 \cdot c1a) + (c1 \cdot cks) \qquad (1)$$

Figure 2D:
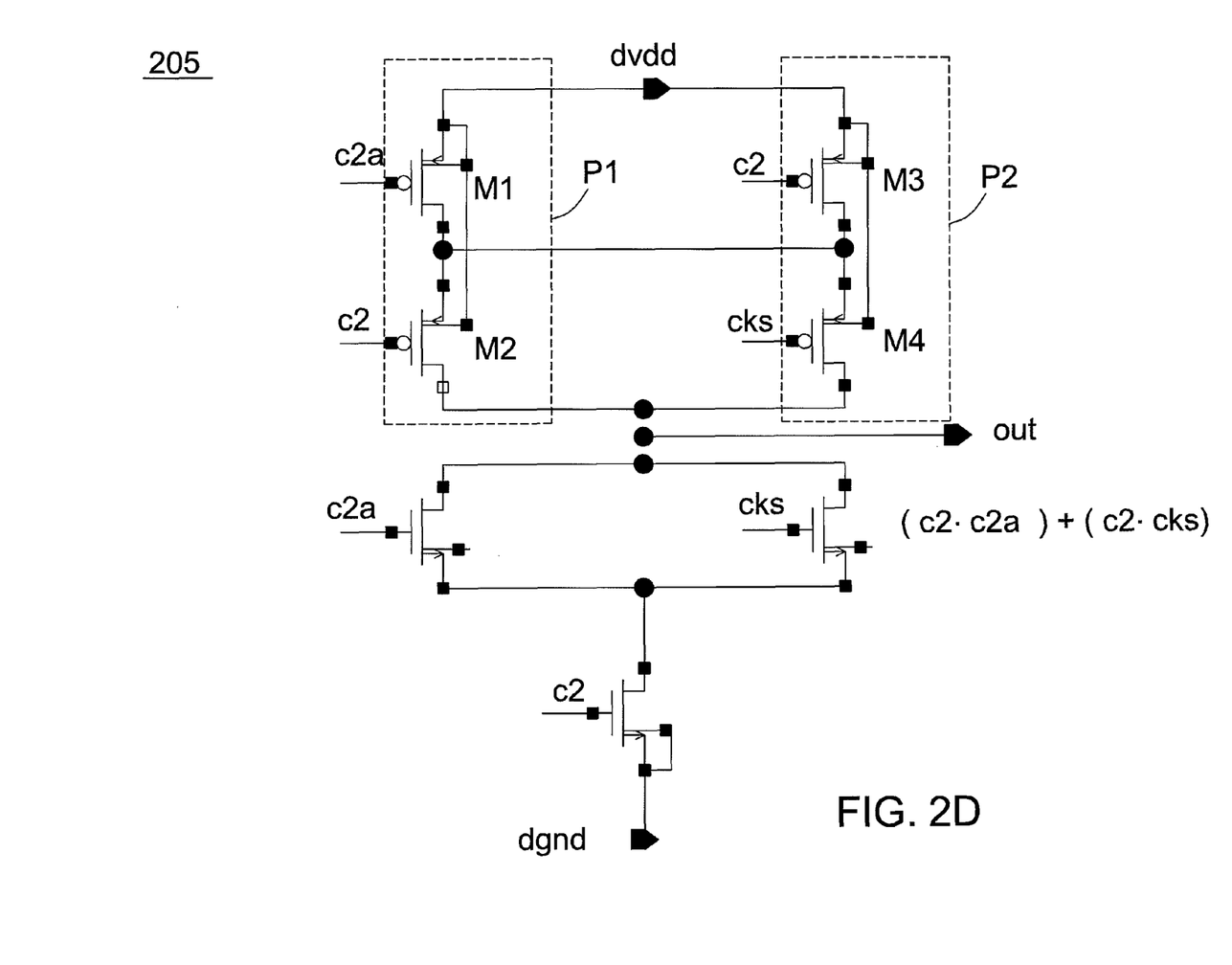
FIG. 2D shows a schematic diagram illustrating a calculating unit in another embodiment of the invention.
Figure 2E:
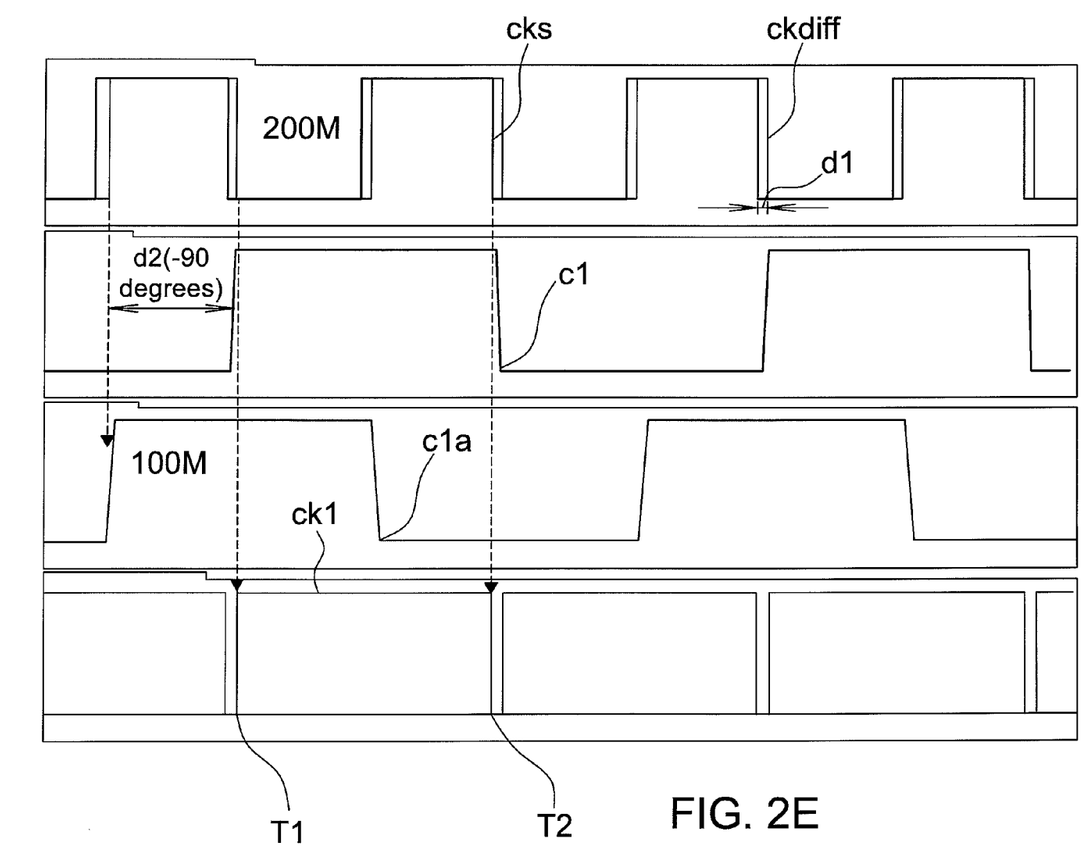
FIG. 2E shows waveforms of a clock generation device in an embodiment of the invention.

In this manner, as shown in FIG. 2E, the first calculating unit 204 determines a trigger time of a first edge (positive edge) of a first output clock ck1 with reference to voltage levels of the first frequency-divided clock c1a and the first delay clock c1. For example, at time T1, the first frequency-divided clock c1a is at a high-voltage level 1 and the first delay clock c1 is at a high-voltage level 1; thus, based on the product result of (c1·c1a), the positive edge of the first output clock ck1 can be triggered.

On the other hand, the first calculating unit 204 determines a falling time of a second edge (negative edge) of the first output clock ck1 with reference to voltage levels of the input clock cks and the first delay clock c1. For example, at time T2, the input clock cks is at a low-voltage level 0 and the first delay clock c1 is at a high-voltage level 1; thus, based on the product result of (c1·cks), the first output clock ck1 can be reduced to a low-voltage level 0 at time T2 to form the negative edge of the first output clock ck1.

It should be noted that the first calculating unit 204 may include a plurality of first paths P1 and a plurality of second paths P2 to be supplied to other clock generation devices for calculation.

As shown in FIG. 2D, the second calculating unit 205 comprises a plurality of transistors M1, M2, M3, and M4. The transistor M1 receives the second frequency-divided clock c2a. The transistor M2 is coupled to the transistor M1 and receives the second delay clock c2. The transistor M3 is coupled to the transistor M1 and receives the second delay clock c2. The transistor M4 is coupled to the transistors M3 and M2 and receives the input clock cks.

In one embodiment, both the transistors M1 and M2 are connected in series to form a first path P1 and both the transistors M3 and M4 are connected in series to form a second path P2. The first path P1 and the second path P2 are connected in parallel to execute the following equation:

$$Ck2 = (c2 \cdot c2a) + (c2 \cdot cks) \qquad (2)$$

The method to generate the output clock ck2 by the second calculating unit 205 is the same as that described in connection with the first calculating unit 204. Thus, its details are not given hereinafter.

Figure 3:
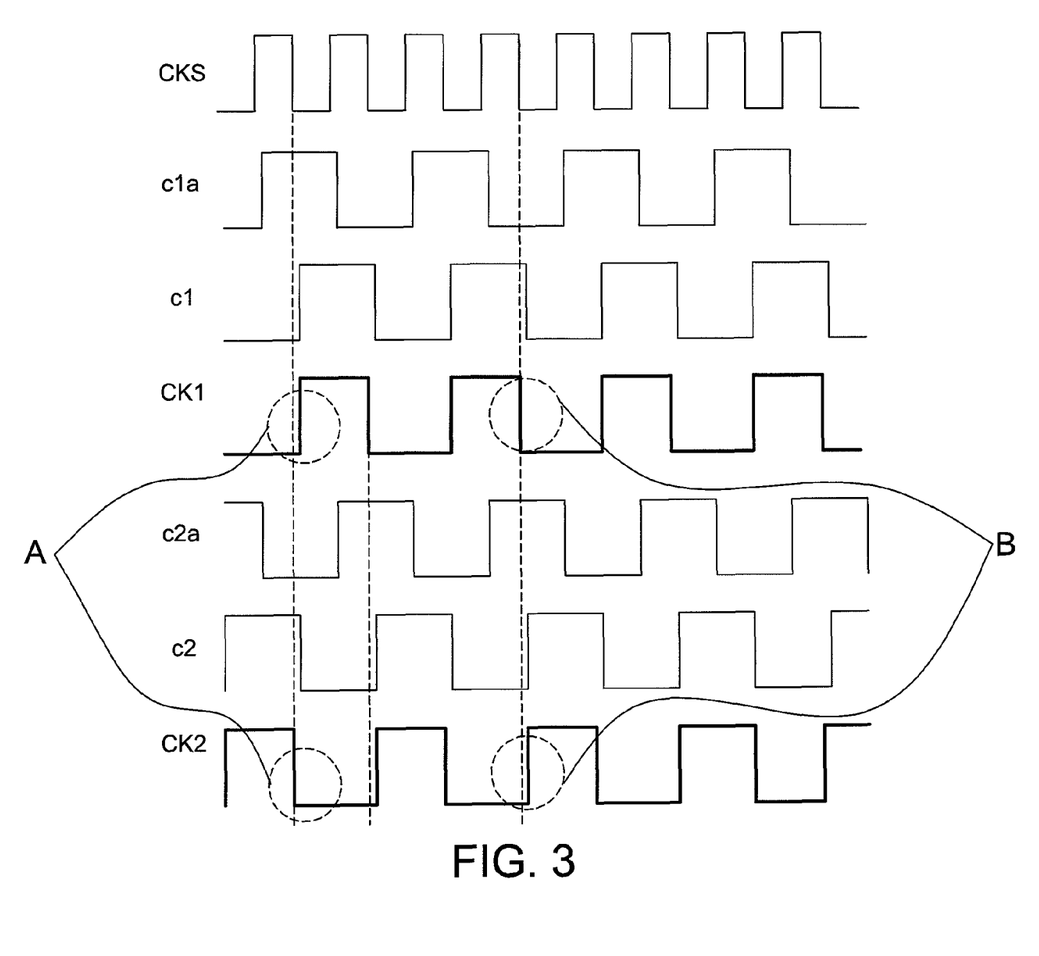
FIG. 3 shows waveforms of a clock generation device in an embodiment of the invention.

Please simultaneously refer to FIG. 2E and FIG. 3. FIG. 3 shows a schematic diagram illustrating related clocks of the first calculating unit 204 and the second calculating unit 205. The following uses the positive edge and the negative edge for further illustration. In the clock generation device 200 of the present invention, the first frequency-divided clock c1a and the first delay clock c1 that determine the positive edge of the first output clock ck1 are generated with reference to the input delay clock ckdiff while the negative edge of the second output clock ck2 is determined by the input clock cks. Since there is a delay of a preset period dl between the input clock cks and the input delay clock ckdiff, the edges of both the clocks c1a and c1 lag behind the clock cks. Therefore, the positive edge of the first output clock ck1 and the negative edge of the second output clock ck2 do not overlap, as shown in two dashed-line circles A of FIG. 3. On the other hand, the negative edge of the first output clock ck1 is determined with reference to the input clock cks while the second frequency-divided clock c2a and the second delay clock c2 that determine the positive edge of the second output clock ck2 are generated with reference to the input delay clock ckdiff. Since there is a delay of a preset period d1 between the input clock cks and the input delay clock ckdiff, the edges of both the clock c2a and c2 lag behind the clock cks. Therefore, the negative edge of the first output clock ck1 and the positive edge of the second output clock ck2 do not overlap, as shown in two dashed-line circles B of FIG. 3.

In this manner, the clock generation device of the present invention uses the first calculating unit 204 and the second calculating unit 205 to generate the first output clock ck1 and the second output clock ck2, that is, non-overlapping clocks. Then, the non-overlapping output clocks ck1 and ck2 are provided to an M-channel time-interleaved analog-to-digital converter (TI-ADC) where M represents an integer. The clock generation device of the present invention uses logic circuits to control the stop-sampling edges of the output clocks ck1 and ck2 without the mismatch problem due to misalignment of sampling timing. Besides, no longer delay path like the prior art is required so as to reduce the mismatch problem caused by mismatch of the path lengths between the output clocks ck1 and ck2 generated by the clock generation device of the prior art. Non-overlapping clocks can be provided precisely and the mismatch problem due to long signal paths in the prior art can be resolved.

Figure 4:
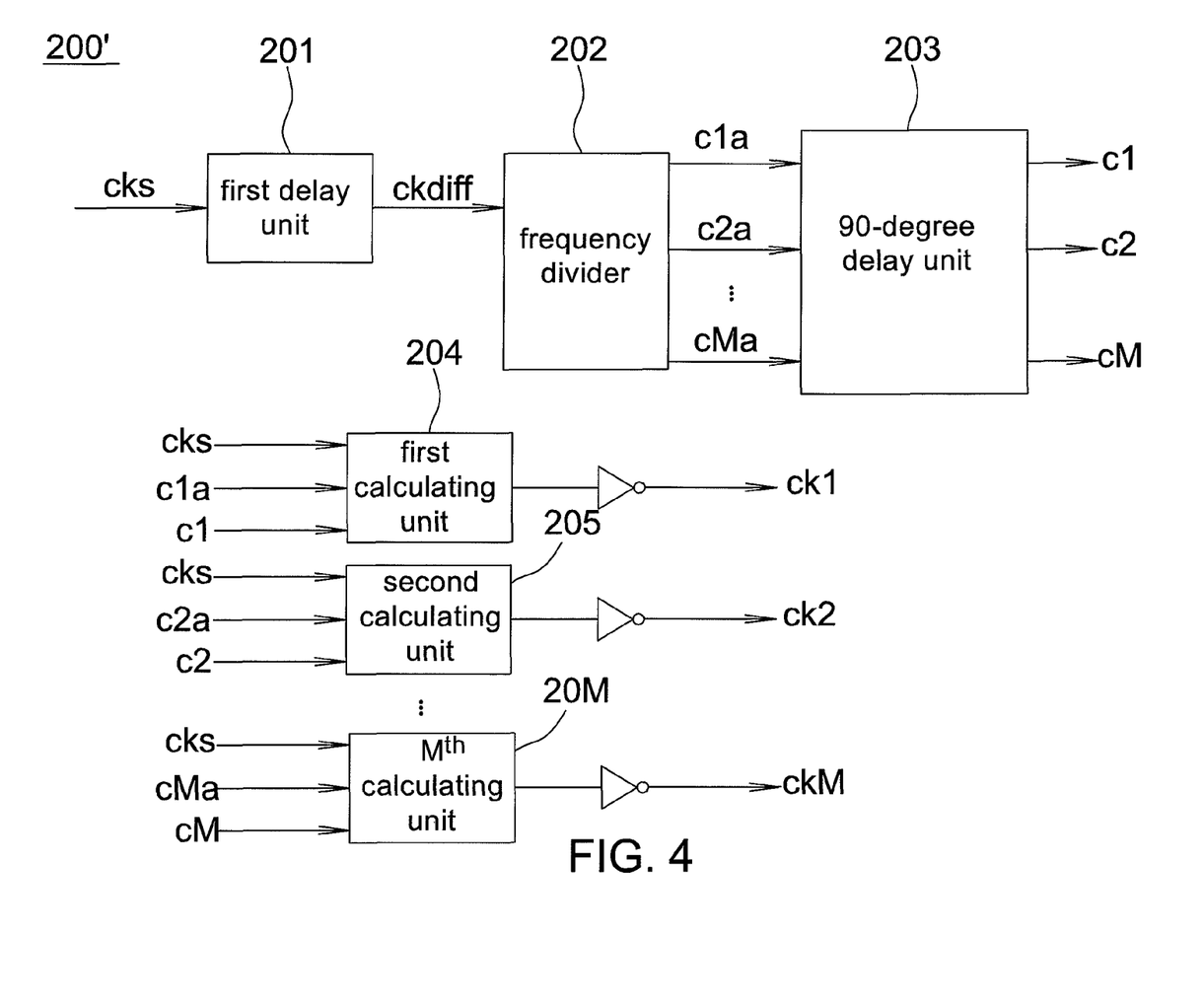
FIG. 4 shows a schematic diagram illustrating a clock generation device in another embodiment of the invention.

It should be noted that in this embodiment the clock generation device generates two non-overlapping output clocks ck1 and ck2 but the present invention is not limited to this example. The clock generation device can generate a plurality of non-overlapping output clocks and the number of clocks can be adjusted to meet various requirements. As shown in FIG. 4, in the clock generation device 200', the frequency divider 202 generates M frequency-divided clocks c1a~cMa (where M represents an integer); M delay units are used to generate M delay clocks c1~cM; and M calculating units 204, 205, . . . are used to generate non-overlapping output clocks ck1~ckM for a M-channel time-interleaved analog-to-digital converter.

Figure 5:
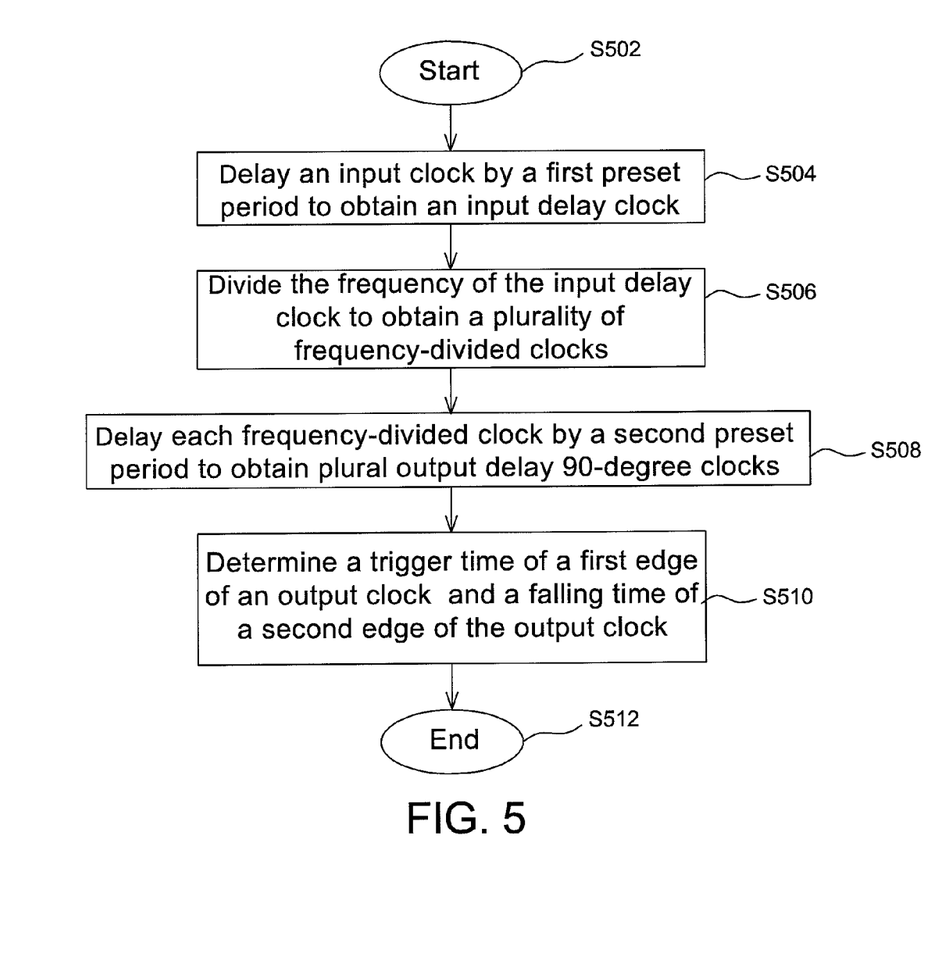
FIG. 5 shows a flow chart of a clock generation method in an embodiment of the invention.

FIG. 5 shows a flow chart of a clock generation method in an embodiment of the invention. The method comprises the following steps:

Step S502: Start.

Step S504: Receive an input clock and delay the input clock by a preset period to obtain an input delay clock.

Step S506: Receive the input delay clock and dividing a frequency of the input delay clock to obtain a plurality of frequency-divided clocks wherein each frequency of each frequency-divided clock is a preset multiple of the input delay clock.

Step S508: Delay each frequency-divided clock by a second preset period to obtain a plurality of output delay 90-degree clocks.

Step S510: Determine a trigger time of a first edge of an output clock with reference to voltage levels of one of the frequency-divided clocks and one of the output delay 90-degree clocks and determine a falling time of a second edge of the output clock with reference to voltage levels of the input clock and the output delay 90-degree clock wherein the output clocks do not overlap with each other.

Step S512: End.

Although the present invention has been fully described by the above embodiments, the embodiments should not constitute the limitation of the scope of the invention. Various modifications or changes can be made by those who are skilled in the art without deviating from the spirit of the invention.

What is claimed is:

1. A clock generation device, comprising:
   a first delay unit for receiving an input clock and delaying the input clock by a first preset period to generate an input delay clock;
   a frequency divider for receiving the input delay clock and dividing a frequency of the input delay clock to generate a first frequency-divided clock and a second frequency-divided clock, wherein a frequency of each of the first frequency-divided clock and the second frequency-divided clock is a preset multiple of the input delay clock;
   an angle delay unit for delaying the first frequency-divided clock by a second preset period to generate a first delay clock at a first output terminal of the angle delay unit; and
   a first calculating unit for determining a trigger time of a first edge of a first output clock with reference to voltage levels of the first frequency-divided clock and the first delay clock and determining a falling time of a second edge of the first output clock with reference to voltage levels of the input clock and the first delay clock.

2. The device according to claim 1, wherein the angle delay unit delays the first frequency-divided clock by the second preset period and generates a second delay clock at a second output terminal of the angle delay unit; and wherein the clock generation device further comprises:
   a second calculating unit for determining a trigger time of a first edge of a second output clock with reference to voltage levels of the second frequency-divided clock and the second delay clock and determining a falling time of a second edge of the second output clock with reference to voltage levels of the input clock and the second delay clock.

3. The device according to claim 1, wherein the first edge is a positive edge and the second edge is a negative edge.

4. The device according to claim 1, wherein the preset multiple is one-half.

5. The device according to claim 2, wherein the second preset period is 90 degrees of a cycle.

6. The device according to claim 1, wherein the first output clock and the second output clock are non-overlapping clocks.

7. The device according to claim 1, wherein the first calculating unit comprises a first transistor, a second transistor, a third transistor and a fourth transistor, wherein the first transistor receives the first frequency-divided clock and the second transistor is coupled to the first transistor and receives the first delay clock, wherein the third transistor is coupled to the first transistor and receives the first delay clock, and wherein the fourth transistor is coupled to the second and the third transistors and receives the input clock.

8. The device according to claim 7, wherein both the first transistor and the second transistor are connected in series to form a first path, wherein both the third transistor and the fourth transistor are connected in series to form a second path, and wherein the first path and the second path are connected in parallel to execute an equation given by: $ck1=(c1 \cdot c1a)+(c1 \cdot cks)$, where $ck1$ denotes the first output clock, $c1a$ denotes the first frequency-divided clock, $c1$ denotes the first delay clock, and $cks$ denotes the input clock.

9. The device according to claim 1, wherein the second calculating unit comprises a first transistor, a second transistor, a third transistor and a fourth transistor, wherein the first transistor receives the second frequency-divided clock and the second transistor is coupled to the first transistor and receives the second delay clock, wherein the third transistor is coupled to the first transistor and receives the second delay clock, and wherein the fourth transistor is coupled to the second and the third transistors and receives the input clock.

10. The device according to claim 9, wherein both the first transistor and the second transistor are connected in series to form a first path, wherein both the third transistor and the fourth transistor are connected in series to form a second path, wherein the first path and the second path are connected in parallel to execute an equation given by: $ck2=(c2 \cdot c2a)+(c2 \cdot cks)$, where $ck2$ denotes the second output clock, $c2a$ denotes the second frequency-divided clock, $c2$ denotes the second delay clock, and $cks$ denotes the input clock.

11. A clock generation device, comprising:
    a first delay unit for receiving an input clock and delaying the input clock by a first preset period to generate an input delay clock;
    a frequency divider for receiving the input delay clock and dividing a frequency of the input delay clock to generate a plurality of frequency-divided clocks, wherein each frequency of each frequency-divided clock is a preset multiple of the input delay clock;
    an angle delay unit, delaying each frequency-divided clock by a second preset period to generate a plurality of output delay clocks; and
    a plurality of calculating units, each determining a trigger time of a first edge of an output clock with reference to voltage levels of one frequency-divided clock and one output delay clock and determining a falling time of a second edge of the output clock with reference to voltage levels of the input clock and the output delay clock;
    wherein the output clocks generated by the calculating units do not overlap with each other.

12. The device according to claim 11, wherein the output delay clocks are supplied to a multiple-channel time-interleaved analog-to-digital converter.

13. The device according to claim 11, wherein the calculating unit comprises a first transistor, a second transistor, a third transistor and a fourth transistor, wherein the first transistor receives the frequency-divided clock and the second transistor is coupled to the first transistor and receives the output delay clock, wherein the third transistor is coupled to the first transistor and receives the output delay clock, and wherein the fourth transistor is coupled to the second and the third transistors and receives the input clock.

14. The device according to claim 13, wherein both the first transistor and the second transistor are connected in series to form a first path, wherein both the third transistor and the fourth transistor are connected in series to form a second path, and wherein the first path and the second path are connected in parallel to execute an equation given by: $ck=(c \cdot ca)+(c \cdot cks)$ where $ck$ denotes represents the output clock, $ca$ denotes the frequency-divided clock, $c$ denotes the output delay clock, and $cks$ denotes the input clock.

15. The device according to claim 11, wherein the second preset period is 90 degrees of a cycle.

16. A clock generation method, comprising:
    delaying an input clock by a first preset period to obtain an input delay clock;
    dividing a frequency of the input delay clock to obtain a plurality of frequency-divided clocks wherein each frequency of each frequency-divided clock is a preset multiple of the input delay clock;

delaying each frequency-divided clock by a second preset period to obtain a plurality of output delay angle clocks; and determining a trigger time of a first edge of an output clock with reference to voltage levels of both one of the frequency-divided clocks and one of the output delay angle clocks and determining a falling time of a second edge of the output clock with reference to voltage levels of both the input clock and the output delay angle clock;

wherein the output clocks do not overlap with each other.

17. The method according to claim 16, wherein the output delay angle clock has a delay angle of 90 degrees.

* * * * *